Sept. 8, 1970 D. E. CUZNER ET AL 3,527,989

CIRCUIT ASSEMBLY

Filed Feb. 7, 1969 6 Sheets-Sheet 1

INVENTORS
DAVID E. CUZNER
PATRICK J. MULHOLLAND

BY Joseph L. Spiegel
ATTORNEY

Sept. 8, 1970 D. E. CUZNER ET AL 3,527,989

CIRCUIT ASSEMBLY

Filed Feb. 7, 1969 6 Sheets-Sheet 3

Sept. 8, 1970 D. E. CUZNER ET AL 3,527,989

CIRCUIT ASSEMBLY

Filed Feb. 7, 1969 6 Sheets-Sheet 5

Sept. 8, 1970 D. E. CUZNER ET AL 3,527,989

CIRCUIT ASSEMBLY

Filed Feb. 7, 1969 6 Sheets-Sheet 6

United States Patent Office 3,527,989
Patented Sept. 8, 1970

3,527,989

CIRCUIT ASSEMBLY

David E. Cuzner, Ampfield, Romsey, and Patrick J. Mulholland, Chandler's Ford, England, assignors to International Business Machines Corporation, Armonk, N.Y., a corporation of New York Filed Feb. 7, 1969, Ser. No. 797,477
Claims priority, application England, Feb. 13, 1968, 7,012/68
Int. Cl. H05k *7/20, 1/04*
U.S. Cl. 317—100 7 Claims

ABSTRACT OF THE DISCLOSURE

A circuit assemby comprises a supporting structure and a plurality of printed circuit cards mounted in spaced apart relationship on the supporting structure. The circuit cards each have an aperture and support and provide interconnections between a plurality of circuit elements. A tube extends through the apertures to supply cooling air to the circuit elements. The tube is removable from the assembly to permit removal of any one of the cards from the structure without disturbing the remaining cards.

BACKGROUND OF THE INVENTION

This invention relates to circuit assemblies and in particular to improvements and modifications of the circuit assembly described in the specification of a copending application for Letters Patent, Ser. No. 741,700 filed July 1, 1968 and assigned to the same assignee as the present invention, hereinafter referred to as the parent specification.

The parent specification describes a circuit assembly in which a plurality of printed circuit cards are mounted on a tube which extends through apertures in the cards and distributes cooling air to circuit modules mounted on the cards. Individual circuit cards, except for the one mounted at the end of the tube, can only be removed after first removing one or more other cards from the tube.

SUMMARY OF THE INVENTION

According to the invention a circuit assembly comprises a supporting structure, a plurality of printed circuit cards mounted in spaced apart relationship in said supporting structure, the circuit cards each having an aperture and supporting and providing interconnections between a plurality of circuit elements, and a tube extending through the apertures to supply cooling air to the circuit elements, the tube being removable from the assembly.

Preferably, the supporting structure is such that any one of the cards can be removed from the supporting structure without disturbing the other cards.

The circuit cards of the circuit assembly described in the parent specification are electrically interconnected by circuit boards forming the air distribution tube. These electrical interconnections are made by spring fingers soldered to the circuit cards which are cammed down onto the tube by axial pressure applied to the stack of cards on the tube. It has been found difficult with this arrangement to maintain mechanical tolerances along the tube and that there is an excessive build up of forces along the tube.

In the circuit assembly described herein the tube is expandable to effect contact between printed circuit boards forming the tube and electrical connectors attached to the circuit cards.

BRIEF DESCRIPTION OF THE DRAWING

The invention will now be described with reference to the accompanying drawing, in which.

GENERAL DESCRIPTION

Figure 1:
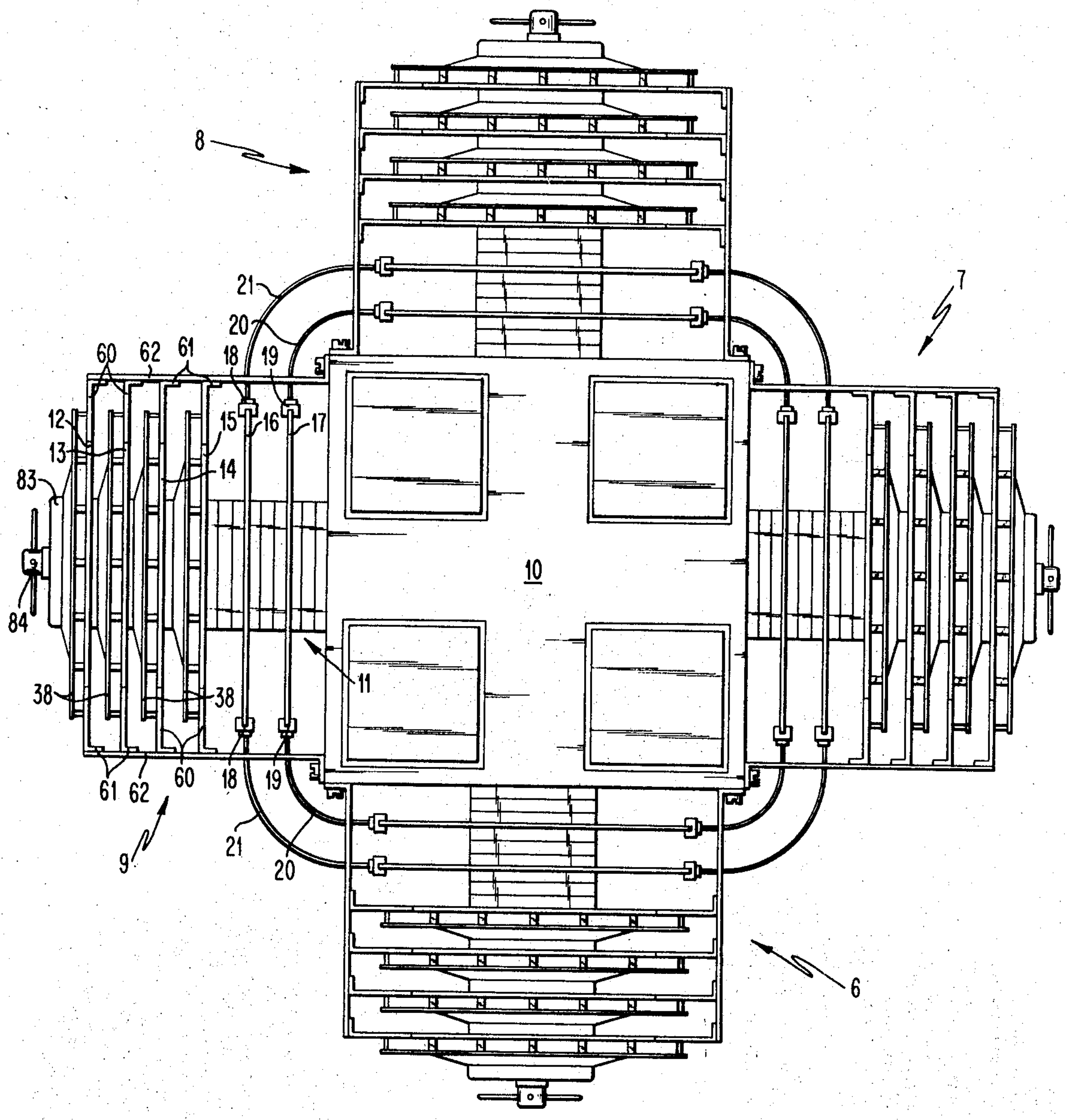
FIG. 1 is a simplified plan view showing the general arrangement of a circuit assembly embodying the invention.

A circuit assembly embodying the invention is shown diagrammatically in FIG. 1 and comprises a central air distribution box 10 of square cross section, and four sub-assemblies, 6 through 9 projecting one from each face of the central air distribution box 10. Only sub-assembly 9 will be described since the remaining sub-assemblies 6 through 8 are similar in construction.

Sub-assembly 9 comprises an air distribution tube 11 communicating with the air box 10 and extending through the aligned apertures of a plurality of apertured multi-layered printed circuit cards 12 through 17.

The printed circuit cards 12 through 15 each carry a plurality of micro-modules and provide the interconnection wiring required between those modules. The logic input/output connections required to the modules on a card are brought to printed circuit lands at the edge of the central aperture of the card. Connector assemblies are provided for establishing electrical contact between these printed lands at the edges of the card and printed circuit lands on the air distribution tube 11. The air distribution tube 11 is of square cross section and includes four multi-layered printed circuit boards. The printed circuit wiring of the air distribution tube 11 provides the wiring interconnections between the printed circuit cards 12, 13, 14 and 15. The input/output connections to the group of cards 12, 13, 14, 15 are taken along the air distribution tube towards the central air distribution box 10 and brought out to further printed lands on the outer surface of the tube. Printed circuit cards 16 and 17 also have printed circuit lands at edges of their apertures which are connected to the corresponding printed circuit lands on the air distribution tube 11 by connector assemblies similar to those which interconnect circuit cards 12, 13, 14 and 15 to the air distribution tube 11. However, the cards 16 and 17 do not carry micro-modules but provide electrical connections to further printed circuit lands at their outer edges.

Conventional connectors 18 and 19 provide electrical connections from the printed circuit lands at the outer edges of interconnection cards 16 and 17 through tape cables 20 and 21 to further conventional interconnecting means connected to interconnecting cards in sub-assemblies 6 and 8. The interconnecting cards 16 and 17 also provide input/output connections between the circuit assembly as a whole and the outside world.

Cooling of the micro-modules mounted on the circuit cards 12, 13, 14 and 15 is effected by a stream of cooling air which passes from the central air distribution box through holes in the air distribution tube 11 between the circuit cards and radially outwardly of the air distribution tube between the adjacent circuit cards 12 and 13, 13 and 14, 14 and 15 and over the micro-modules mounted on those cards. The stream of cooling air may be provided by a fan connected to the central air distribution box 10 by a duct.

Instead of being a rigid tube as in the circuit assembly described in the parent specification, the air distribution tubes in the circuit assembly described herein is expandable. It is inserted in its contracted state through the apertures if the cards which are supported by a supporting structure extending outwardly from the air box 10. The supporting structure supports the cards with their apertures accurately aligned. After insertion, the tube is expanded to contact spring contacts of the connector assemblies.

Having described the general construction of the circuit assembly the individual components and their interrelation will be described in more detail below.

DETAILED DESCRIPTION

Modules

Each module 22 is preferably of a construction which maximizes the heat dissipation therefrom to the current of air which passes over it. The modules include integrated circuits mounted on a substrate and encapsulated in a metal can in thermal contact with the integrated circuit. Metal extension pins of square cross section project from the upper surface of the metal can. From the lower surface of the substrate project inter-connecting pins which are soldered into holes in the circuit cards provide electrical connections to the circuits in the module. Alternatively, the modules may be provided with contact tabs soldered directly to printed circuit lands on the cards. The square section pins provide a turbulent flow of the air over the module and improve the exchange of heat between the module and the cooling air. Extension pins of other shapes may be used, for example, pins of paraboloid shape have good heat exchange characteristics.

Circuit cards

Figure 3:
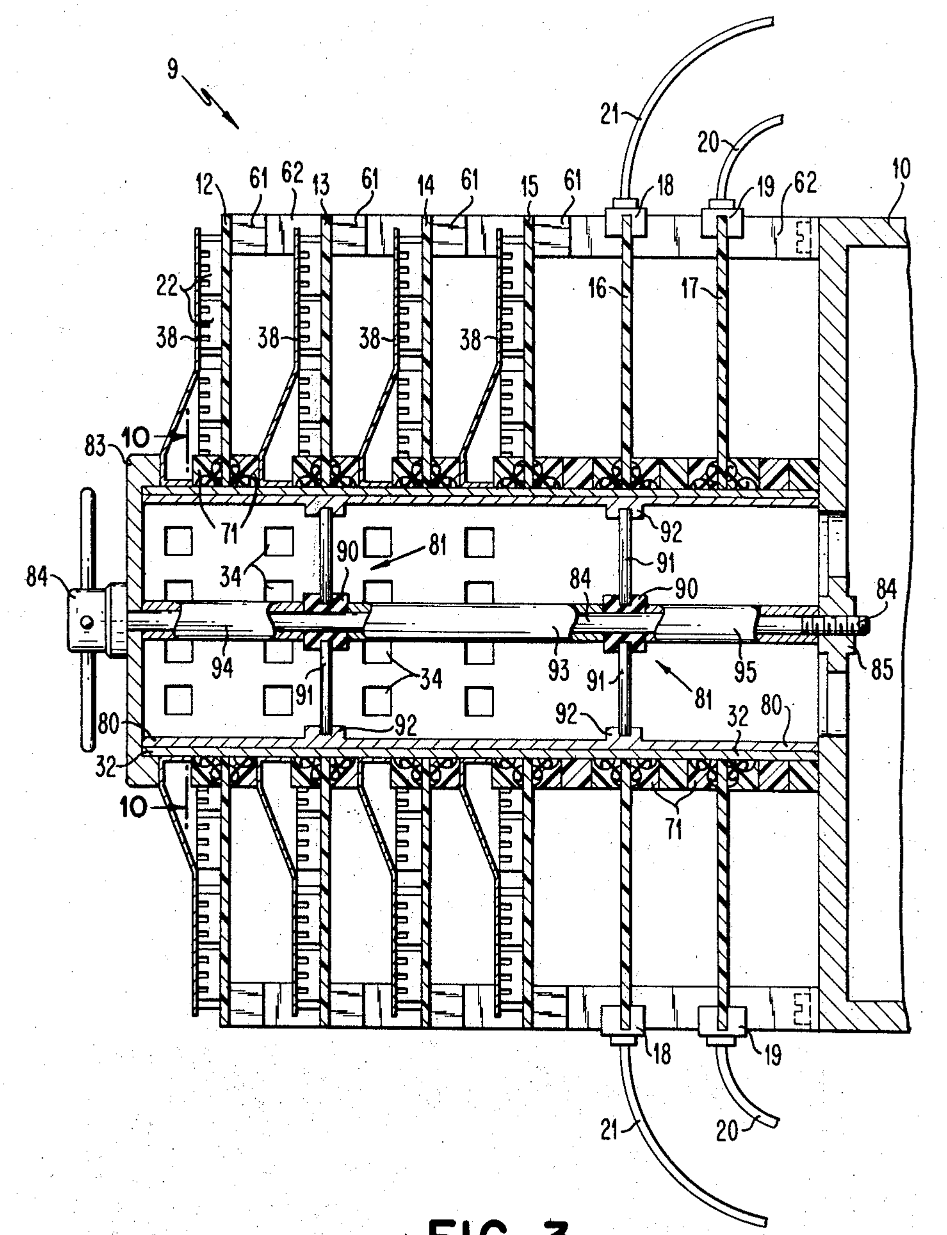
FIG. 3 is a cross sectional plan view of the circuit assembly shown in FIG. 2.
Figure 4:
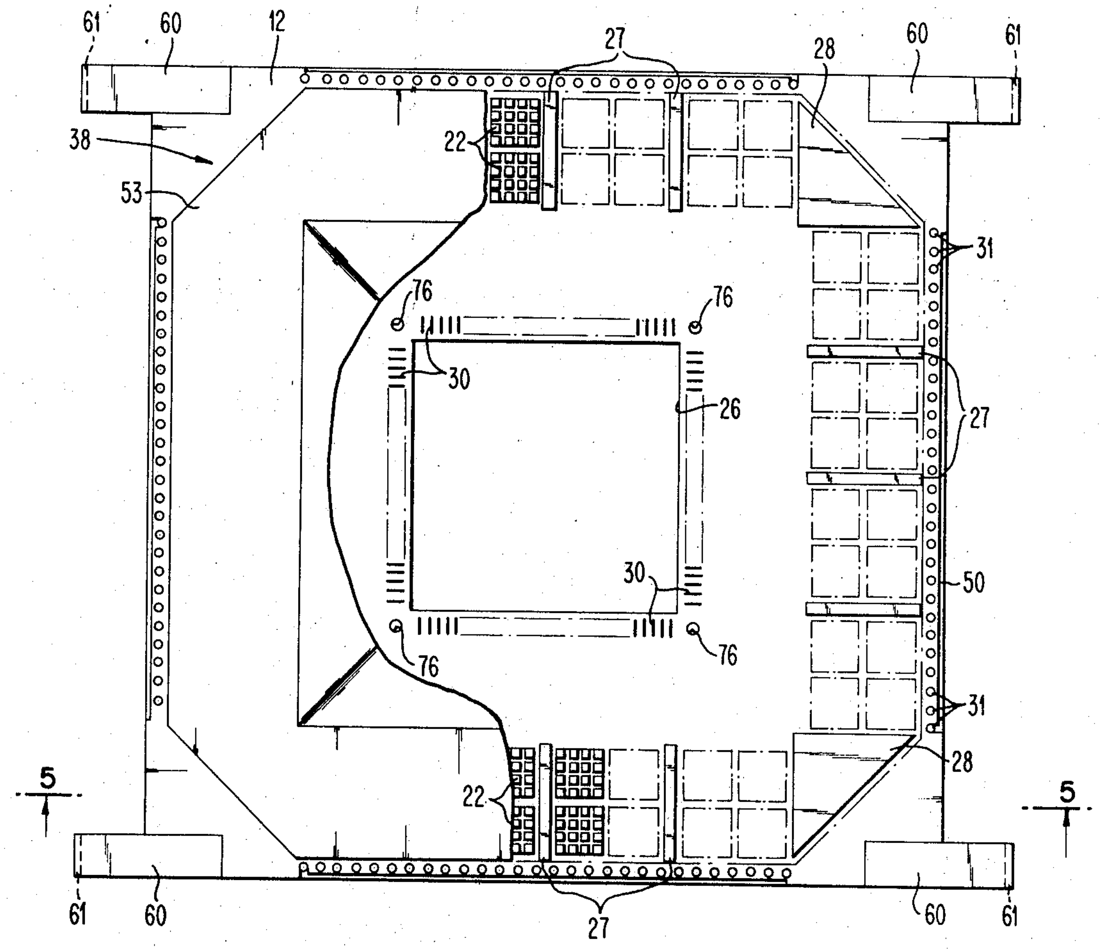
FIG. 4 is a front view of a circuit card for the circuit assembly shown in FIGS. 1 to 3.
Figure 5:
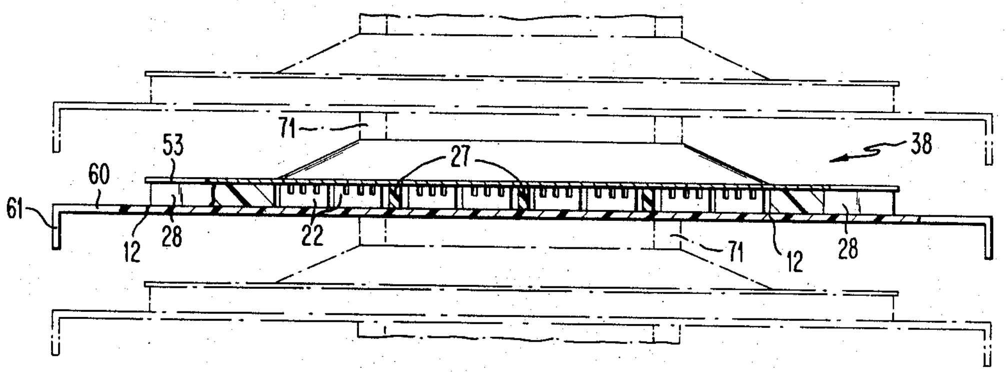
FIG. 5 is an end view of a circuit card assembly.
Figure 6:
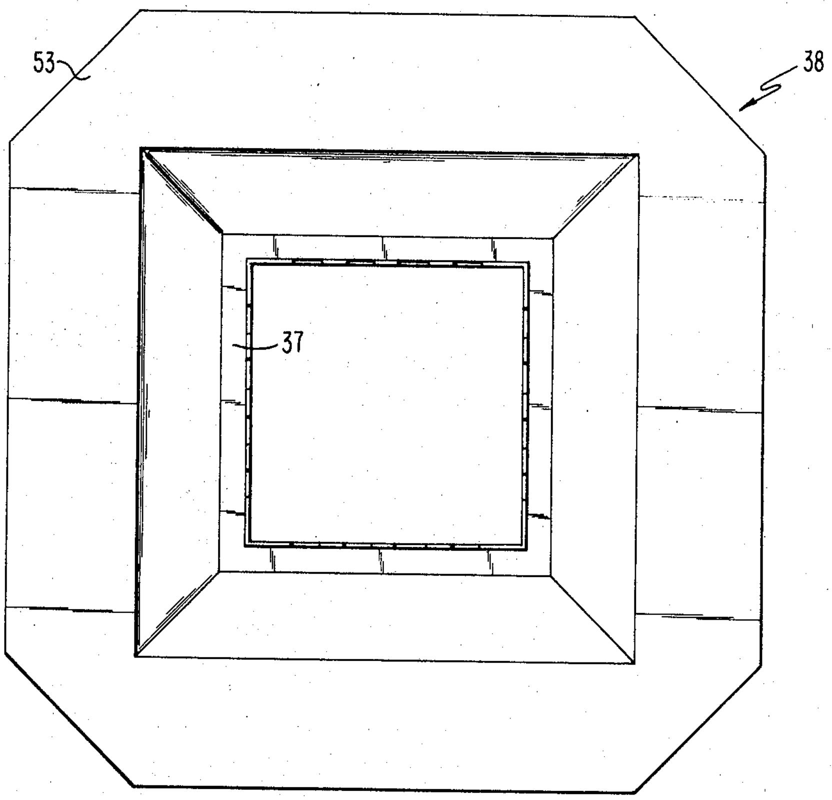
FIG. 6 is a rear view of a baffle.

Referring now to FIG. 4 each circuit card 12 through 15 is a multilayered structure formed with a central square aperture 26. The circuit modules 22 are arranged on the front of the card and distributed around the central aperture as shown in FIG. 4. The modules are arranged in closely packed groups of 4 separated by spacers 27 and 28 which close the gaps between the groups of modules so that the flow of air is directed over the modules. This aspect of the construction will be more fully appreciated by reference to FIG. 5 which is an end view of the circuit card shown in FIG. 3 in juxtaposition with a baffle 38, described in more detail below, which confines the air flow from the central air distribution tube 11 to pass over the metal pins of the modules.

The input/output logic connections to the circuit card are brought out to printed circuit lands 30 on both faces of the card around the central aperture. Rows of plated through holes 31 are provided at the outer edges of the circuit card 12 to provide probing points for testing the circuitry on the card. The plated through holes are connected by printed wiring in the card to points in the circuitry of the card which may from time to time require testing. Printed circuit strips 50 at the extreme edges of the card are connected to ground potential so that testing of voltage levels in the assembly may be carried out with reference to ground potential.

Power stubs 60 are connected one at each corner of each card. As best seen in FIG. 3 the power stubs include portions 61 extending at right angles to the card for connection to power buses 62 extending outwardly from the air box. The power stubs carry a number of voltage supply tabs on one side and a ground tab on the other side. The tabs are soldered at one end to lands on the card and are clamped at the other end on portion 61 to the appropriate conductors of the buses 62.

The interconnection cards 16 and 17 are multilayered cards of similar shape to the circuit card shown in FIG. 3 but they do not bear modules. They are provided with printed circuit lands around the edges of the central aperture for connection to the tube 11 and around the outer edges for connection to conventional card connectors 18 and 19.

Connector assembly

Figure 7:
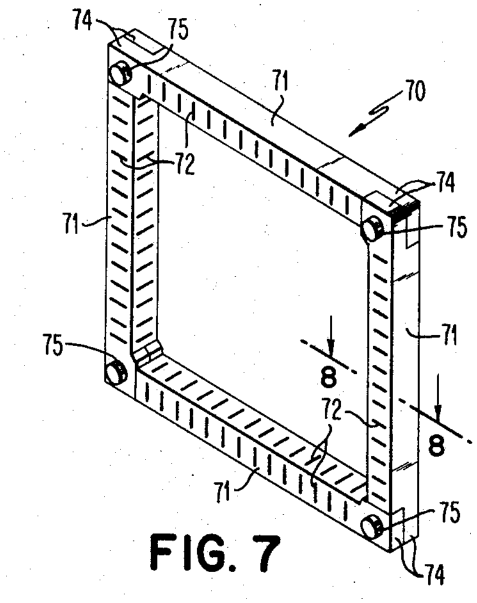
FIG. 7 is a perspective view of a connector assembly.
Figure 8:
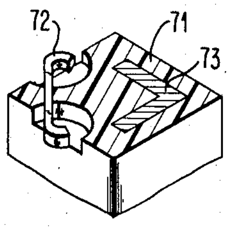
FIG. 8 is a cross-section of a connector.

Each card 12 through 17 is connected to the air distribution tube 11 by two connector assemblies, each as shown in FIG. 7, one located on each face of the card. Each connector assembly 70 comprises four separately replaceable connectors 71, of cross section as shown in FIG. 8, each having spaced apart spring contacts 72 arranged to make contact between corresponding contact lands on the tube and the card. The connectors are constructed of insulating plastics material and have an internal metal strengthening insert 73 extending along the length of the connectors. Co-operating tongue portions 74 at the ends of the connectors facilitate and strengthen their assembly to form the structure shown in FIG. 7.

The connector assemblies are located relative to their respective cards by dowels which extend through holes 75 in the tongue portions of the connectors and through holes 76 in the cards.

Baffles

Each circuit card is positioned adjacent a baffle 38 which includes spacing portion 37 formed with apertures which are arranged to register with apertures in the air distribution tube to permit air to flow from the tube into the space between the baffle and an adjacent card. The baffle 38 directs the flow of air from apertures 52 over extension pins of the modules, and includes a portion 53 which presents a plane face towards the modules and is arranged to contact the spacers 27 and 28 on the circuit card (see FIG. 5) so that the air flow out of the assembly passes only over the extension pins of the modules.

The baffle 38 associated with each circuit card is located therewith by the dowels which extend through the connectors so that each circuit card forms a sub-assembly with attached connector assembly and baffle at the front and attached connector assembly at the back.

Supporting structure

Figure 2:
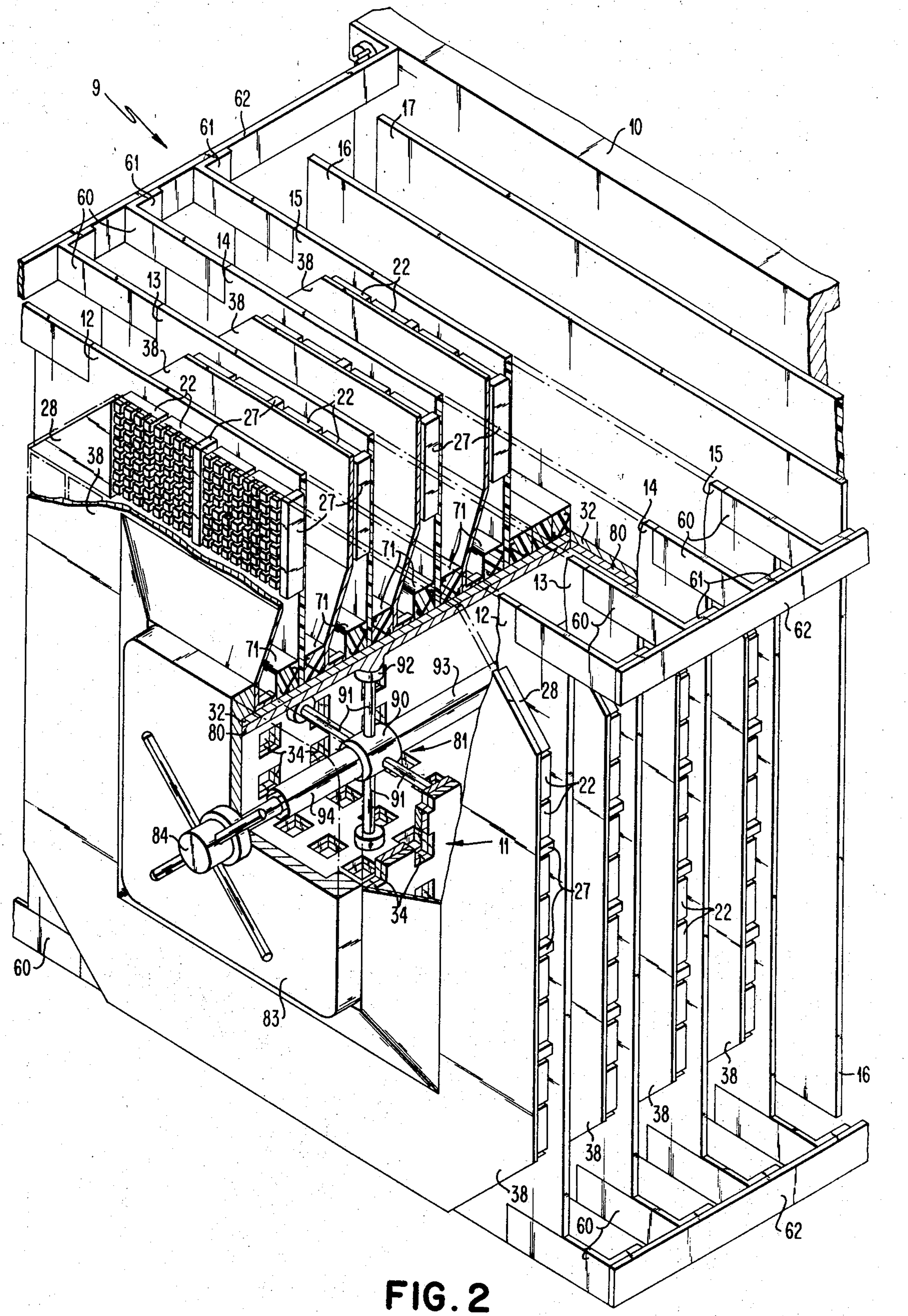
FIG. 2 is a cut away perspective view of part of the circuit assembly of FIG. 1.

The card sub-assemblies are each releasably supported by a supporting structure comprising four power buses 62 which are bolted at one end to the central air distribution box 10 and extend outwardly therefrom as shown in FIGS. 2 and 3. Besides supporting the cards these bus bars carry the power supplies for the circuit cards. The stubs 60 at each corner of the card are clamped to respective ones of the four bus bars 62 by suitable clamps, not shown in the drawing. Each clamp is constructed so that when released it can be withdrawn along the bus bar 62 to permit withdrawal and reinsertion of any one of the card assemblies without disturbing the others. The air distribution tube must, of course, be withdrawn before a card assembly can be removed.

Air distribution tube

Figure 9:
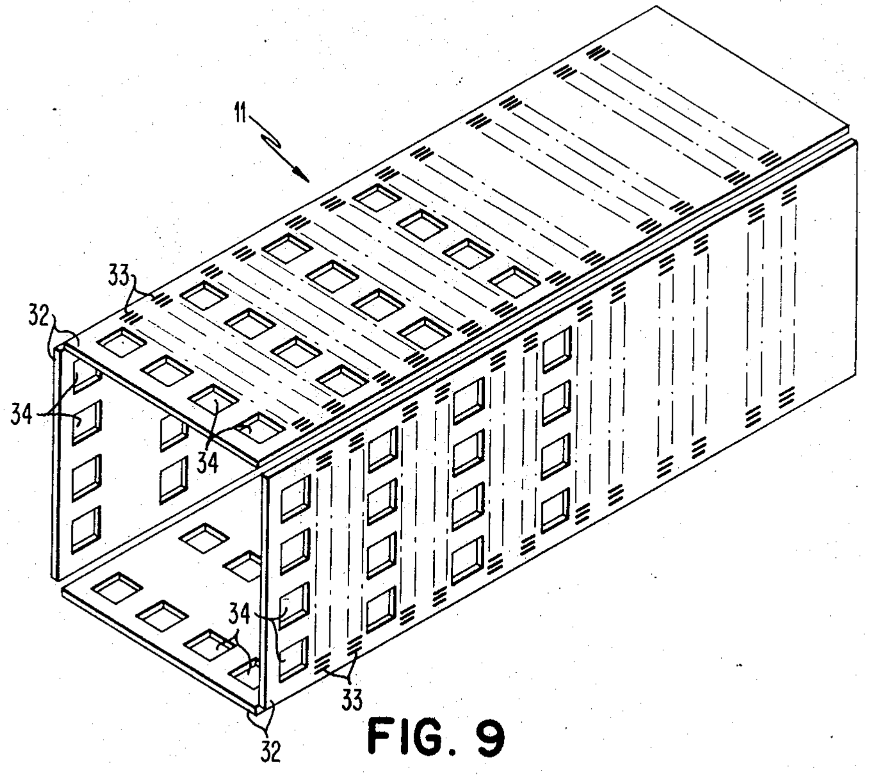
FIG. 9 is a perspective view of the circuit boards forming an air distribution tube.

The printed circuit boards 22 forming one of the air distribution tubes are shown in FIG. 9. Each board 32 is multilayered and is provided with a number of rows 33 of printed circuit lands. Adjacent pairs of rows 33 are connected to front and back connectors of a corresponding card. Between each pair of rows 33 is a row of apertures 34 for the passage of cooling air from the air distribution tube to the modules. Although square apertures are shown in the drawing, circular apertures would probably be used in practice since they are easier to machine.

Figure 10:
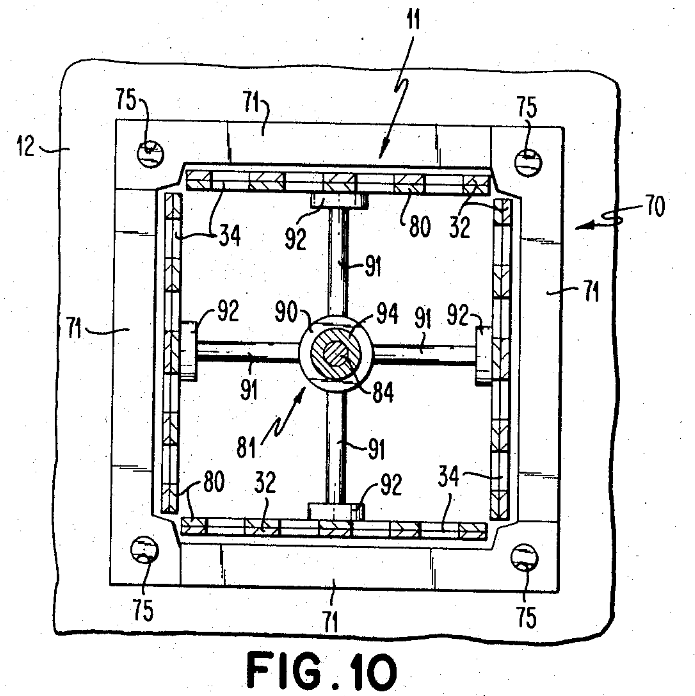
FIG. 10 is a cross-section of an air distribution tube showing its relationship to the connector assembly of FIG. 7.

Each board 32 has a backing plate 80 (FIG. 10) to which an expanding force is applied by expanding device 81 to push the boards 32 outwardly into contact with the connectors 71. The tongue portions of the connectors are formed with inclined guide surfaces 82 which centre the boards with respect to the connectors as they are pushed into contact with the spring fingers 72.

The backing plates 80 serve to distribute the forces applied by the expander device and are formed with apertures corresponding in size and position to the apertures 34 of the boards which they support.

The boards 34 and backing plates 80 are located along their major axes by abutment against the side of the air box 10 as shown in FIG. 3.

The end of the air distribution tube is closed by cap 83 which is held tightly against the end of the tube and the outer baffle 38 by actuating bolt 84 which screws into a captive nut 85 in the air box 10.

Expander device

The board expander device 81 comprises two rubber bushes 90 free to move along actuating bolt 84 in each of which is embedded the ends of four equally spaced and generally radially extending struts 91. The outer ends of the struts are a push fit into rubber lined sockets 92 in the backing plate castings 80.

The rubber bushes 90 are spaced apart from each other by a sleeve 93 and from the cap 83 by a further sleeve 94. Thrust discs may be provided at each side of the bushes 90 to distribute the axial thrust of the sleeves 93 and 94 over the annular faces of the rubber bushes 90.

The struts 91 are held at an angle of about 15° to the radial plane by the rubber bushes 90 when the mechanism is in the unloaded condition so that the board expander device with boards attached can readily be inserted through the apertures of the cards. The boards are expanded by screwing the actuating bolt 84 into the captive nut 85 in the air box 10. Initially the ends of the boards are held up against the air box by the pressure of a light spring, not shown, acting between the cap 83 and the first rubber bush 90. Further turning of the actuating bolt moves the rubber bushes axially towards the air box so that the struts assume positions closer to the radial plane thereby expanding the tube. The device is prevented from going over centre by a sleeve 95 on the actuating bolt 84 which abuts against nut 85 when the device is fully expanded.

Cooling

Cooling air is blown from the central air box down the air distribution tube, through the apertures in the backing plates 80 and printed circuit boards 32, through the apertures in the spacing portions 37 of baffle 38, into the spaces between the baffles and their associated printed circuit boards, and is exhausted over the cooling pins of the modules.

It is an important feature of the package that the cooling conditions are substantially identical for each module. To achieve this even distribution of air it may be necessary to decrease the size of the apertures nearer to the closed end of the air distribution tube or to position some form of air guide, for example, of conical or pyramid shape pointing in a direction opposite that of the air flow in the tube. In this context it is important to note that all the module positions on the cards must be filled, either with a circuit module or a dummy with the same air flow characteristics, to maintain even and constant distribution of cooling air.

Wiring changes

The backing plates may have a network of grooves in the face which supports the printed circuit boards to accommodate discrete wires soldered to the reverse side of the boards to effect limited changes in the wiring of the boards.

Servicing

Probe points 31 are provided at the edges of the circuit cards to permit testing of the circuitry to locate a fault.

Individual cards can be removed for repair or replacement without the necessity of removing other cards by releasing the expander device, withdrawing the air distribution tube and releasing the clamps which secure the power stubs 60 of the card to the power buses 62. Faulty connectors 71 are readily replaceable in the event of mechanical failure.

Modifications

The division of the cards into circuit cards and interconnection cards is completely flexible and can be changed to meet the requirements of a particular application. The interconnection cards may carry a small number of circuit modules.

Modules may be mounted both back and front of the circuit cards provided suitable modifications are made to the baffles. The desirability of this arrangement will depend on the ratio of modules to I/O connections on the card because the maximum number of I/O connections is limited by the minimum spacing of the springs 72 of the connectors which is mechanically feasible.

What is claimed is:

1. A circuit assembly comprising a supporting structure, a plurality of printed circuit cards mounted in spaced apart relationship in said supporting structure, the circuit cards each having an aperture and supporting and providing interconnections between a plurality of circuit elements, a tube extending through the apertures to supply cooling air to the circuit elements, the tube being removable from the assembly, and in which the supporting structure comprises a plurality of power buses, the cards each have a plurality of power stubs, and the circuit assembly includes clamping means for clamping the power stubs to the power buses to effect electrical connections to and mechanical support of the cards, such that after the tube has been removed from the assembly, any one of the cards can be released and withdrawn from the structure without releasing the other cards.

2. A circuit assembly as claimed in claim 1, in which the tube is provided with electrical connectors for accomplishing the electrical interconnection between the circuit cards.

3. A circuit assembly as claimed in claim 2, including electrical connectors attached to each of the circuit cards and means for expanding the tube to effect connection of the tube connectors to the card connectors.

4. A circuit assembly as claimed in claim 3, in which the card connectors present resilient contact towards the tube and the outer wall of the tube is formed by printed circuit boards having contact lands as positions corresponding to the resilient contacts.

5. A circuit assembly as claimed in claim 3, in which the tube is formed of three or more separate walls and the tube expanding means comprises an actuator extending axially along the centre of the tube and connected to the walls by a plurality of struts each of which is pivotally mounted at one end to the actuator and at the other to one of the walls, the actuator being operable to move the inner ends of the struts axially of the tube to effect outward expansion of the walls thereof.

6. A circuit assembly as claimed in claim 5, in which the inner ends of each strut is embedded in one of a plurality of rubber bushes mounted on the actuator to provide a resilient pivotal connection of the struts to the actuator.

7. A circuit assembly as claimed in claim 3, in which the walls of the tube are formed by planar printed circuit boards each supported on its inner side by a backing plate.

References Cited

UNITED STATES PATENTS

| | | | |
|---|---|---|---|
| 3,141,999 | 7/1964 | Schneider | 337—100 |
| 2,877,388 | 3/1959 | Reid | 317—101 |

LARAMIE E. ASKIN, Primary Examiner

G. P. TOLIN, Assistant Examiner

U.S. Cl. X.R.

317—101